US012803568B2

(12) United States Patent
Ferlito et al.

(10) Patent No.: US 12,803,568 B2
(45) Date of Patent: Nov. 17, 2026

(54) CUSTOM CAPACITIVE DAC WITH ON CHIP AUTOCALIBRATION FOR HIGH RESOLUTION SUCCESSIVE APPROXIMATION REGISTER ADC

(71) Applicant: STMicroelectronics International N.V., Geneva (CH)

(72) Inventors: Umberto Ferlito, Catania (IT); Rosario Cariola, Giarre (IT); Calogero Marco Ippolito, Aci Castello (IT); Mirko Cassalini, Syracuse (IT)

(73) Assignee: STMicroelectronics International N.V., Geneva (CH)

( * ) Notice: Subject to any disclaimer, the term of this patent is extended or adjusted under 35 U.S.C. 154(b) by 93 days.

(21) Appl. No.: 18/931,348

(22) Filed: Oct. 30, 2024

(65) Prior Publication Data

US 2026/0121651 A1 Apr. 30, 2026

(51) Int. Cl.
*H03M 1/10* (2006.01)

(52) U.S. Cl.
CPC .................................. *H03M 1/1014* (2013.01)

(58) Field of Classification Search
CPC .................................................... H03M 1/1014
See application file for complete search history.

(56) References Cited

U.S. PATENT DOCUMENTS 6,731,232 B1 * 5/2004 Kearney ............... H03M 1/129 341/172
6,958,722 B1 * 10/2005 Janakiraman ......... H03M 1/144 341/161
7,199,746 B1 * 4/2007 Chowdhury .......... H03M 1/468 341/172
7,411,538 B1 * 8/2008 Piasecki ............. H03M 1/0607 341/161

(Continued)

FOREIGN PATENT DOCUMENTS

CN 113839673 A 12/2021

OTHER PUBLICATIONS

Zheng, Yam, et al.: "A 12-Bit, 100 MS/s SAR ADC Based on a Bridge Capacitor Array with Redundancy and Non-Linearity Calibration in 28 nm CMOS," Electronics 2022, 11, 705, Feb. 25, 2022, 18 pgs.

*Primary Examiner* — Lam T Mai
(74) *Attorney, Agent, or Firm* — Crowe & Dunlevy LLC

(57) ABSTRACT

Disclosed herein is a successive approximation register (SAR) analog-to-digital converter (ADC). The ADC includes a capacitive digital-to-analog converter (DAC) including a binary-weighted capacitor array, and a bridge capacitor separating the binary-weighted capacitor array into a first switched capacitor array connected to a first node and a second switched capacitor array connected to a second node, with a first terminal of the bridge capacitor being connected to the first node and a second terminal of the bridge capacitor being connected to the second node. A (Continued)

multipurpose capacitor is connected to the first node, with the multipurpose capacitor serving as both a termination capacitor for the first switched capacitor array and a shield between the first node and the bridge capacitor. A dummy is capacitor connected to the second node and serving as a shield between the second node and the bridge capacitor.

17 Claims, 10 Drawing Sheets

(56) References Cited

U.S. PATENT DOCUMENTS

| | | | | |
|---|---|---|---|---|
| 8,665,125 | B2 * | 3/2014 | Reinhold | H03M 1/1061 341/172 |
| 9,432,044 | B1 * | 8/2016 | Lee | H03M 1/1061 |
| 10,862,498 | B1 * | 12/2020 | Chen | H03M 1/1033 |
| 11,258,410 | B2 * | 2/2022 | Walling | H03F 3/24 |
| 2003/0123646 | A1 * | 7/2003 | Srinivasan | H03M 1/0697 341/155 |
| 2004/0246153 | A1 * | 12/2004 | Leung | H03M 1/1057 341/172 |
| 2004/0246158 | A1 * | 12/2004 | Leung | H03M 1/1057 341/155 |
| 2004/0246159 | A1 * | 12/2004 | Leung | H03M 1/1057 341/172 |
| 2004/0246160 | A1 * | 12/2004 | Leung | H03M 1/1057 341/172 |
| 2004/0246161 | A1 * | 12/2004 | Leung | H03M 1/08 341/172 |
| 2004/0246162 | A1 * | 12/2004 | Leung | H03M 1/0863 341/172 |
| 2004/0246163 | A1 * | 12/2004 | Leung | H03M 1/08 341/172 |
| 2004/0246164 | A1 * | 12/2004 | Leung | H03M 1/1057 341/172 |
| 2004/0267986 | A1 * | 12/2004 | Leung | H03M 1/1057 710/22 |
| 2007/0001890 | A1 * | 1/2007 | Piasecki | H03M 1/186 341/161 |
| 2007/0139243 | A1 * | 6/2007 | Chowdhury | H03M 1/462 341/155 |
| 2010/0039303 | A1 * | 2/2010 | Tsukamoto | H03M 1/1061 341/172 |
| 2010/0156684 | A1 * | 6/2010 | Westwick | H03M 1/0636 341/131 |
| 2010/0295156 | A1 | 11/2010 | Cho et al. | |
| 2012/0025062 | A1 * | 2/2012 | Neubauer | H03M 1/145 341/110 |
| 2012/0105265 | A1 * | 5/2012 | Agarwal | H03M 1/002 341/172 |
| 2012/0280841 | A1 * | 11/2012 | Wang | H03M 1/1295 341/172 |
| 2012/0319886 | A1 * | 12/2012 | Das | H03M 1/68 341/172 |
| 2015/0029048 | A1 * | 1/2015 | Jeon | H03M 1/1023 341/110 |
| 2016/0126967 | A1 * | 5/2016 | Oh | H03M 1/66 341/118 |
| 2016/0182077 | A1 | 6/2016 | Maddox et al. | |

* cited by examiner

CUSTOM CAPACITIVE DAC WITH ON CHIP AUTOCALIBRATION FOR HIGH RESOLUTION SUCCESSIVE APPROXIMATION REGISTER ADC

TECHNICAL FIELD

This disclosure relates to analog-to-digital converters (ADCs), particularly to high-resolution, low-power successive approximation register (SAR) ADCs. More specifically, the disclosed pertains to an improved capacitive DAC design and self-calibration technique for SAR ADCs used in medical applications involving high precision and energy efficiency.

BACKGROUND

High-resolution applications such as medical imaging, precision instrumentation, and high-speed communication systems demand exceptionally high signal-to-noise ratios (SNR) to accurately capture and process analog signals. In these applications, analog-to-digital converters (ADCs) are used for converting analog inputs into digital data with minimal loss of fidelity. It is strongly desired that the noise introduced by the ADC be minimized to a level where it becomes negligible compared to the noise from the preceding analog signal chain. Capacitive successive approximation register (SAR) ADCs are widely used in these systems due to their balance of speed, accuracy, and power efficiency. However, in capacitive SAR ADCs, both noise and nonlinearity can significantly degrade the effective number of bits (ENOB), which is directly related to the SNDR. Consequently, strategies to reduce noise and mismatch are needed for enhancing ADC performance in these demanding applications.

One of the components of interest in a capacitive SAR ADC is the capacitive digital-to-analog converter (DAC). The DAC's performance heavily influences the overall noise and linearity of the ADC. During the sampling phase in a basic fully differential capacitive SAR ADC, the common-mode voltage and input switches are closed. This configuration, along with the input capacitances, forms a first-order filter that introduces thermal noise, commonly referred to as $$kT/C$$

noise. This noise component should be substantially lower than the quantization noise to maintain a high SNR. The most straightforward way to reduce $$kT/C$$

noise is by increasing the total capacitance C, but this approach leads to a larger area occupation on the chip, which may be impractical for high-resolution ADCs. Moreover, a large sampling capacitance necessitates more dissipative drivers for both input and reference voltages, further complicating the design and increasing power consumption.

Reducing noise within the ADC enhances the SNR, which is of particular interest for high-fidelity signal conversion. However, to improve the effective number of bits (ENOB), both noise and distortion are to be minimized because ENOB is directly related to the SNDR. The ENOB can be calculated following the relationship:

$$ENOB = \frac{SNDR - 1.76}{6.04}$$

where the signal-to-noise-and-distortion ratio (SNDR) is defined as:

$$SNDR = 10 \cdot \log_{10} \frac{P_s}{P_n + P_d}$$

with $P_s$ representing the signal power, $P_n$ the noise power, and $P_d$ the distortion power. Improving linearity reduces $P_d$, thereby increasing the ENOB.

In high-resolution capacitive SAR ADCs, achieving a low $$kT/C$$

noise level necessitates a large total input capacitance. Traditional designs use a binary-weighted capacitive digital-to-analog converter (DAC), which is organized into multiple capacitor columns corresponding to each bit of the ADC's resolution. Each column represents a specific bit weight and contains a number of unit capacitors equal to $2^x$, where x is the bit position starting from zero for the least significant bit (LSB).

For example, in a 16-bit capacitive DAC: the most significant bit (MSB), which is bit 15, would require $2^{15=32,768}$ unit capacitors in its column; the next significant bit (MSB-1, bit 14) would require $2^{14}$=16,384 unit capacitors; and this pattern continues down to the LSB, which requires $2^0$=1 unit capacitor.

This exponential increase means that higher-bit columns contain large number of unit capacitors. The cumulative effect leads to a significant total number of capacitors, resulting in substantial area consumption on the integrated circuit. Such extensive area requirements make the implementation of high-resolution ADCs challenging and costly.

To address the area issue, prior art solutions have introduced attenuation capacitors placed between lower and upper capacitor arrays. This technique effectively scales down the required capacitance for higher bits, reducing the total number of unit capacitors needed to achieve the desired DAC behavior. However, to meet the stringent matching requirements for high linearity performance, designers often add dummy capacitors around the active capacitor arrays. These dummy capacitors serve to mitigate edge effects and systematic mismatches but consequently increase the overall area occupation, partially offsetting the area savings gained through the use of attenuation capacitors.

Another challenge in high-resolution ADCs is parasitic coupling resulting from interconnections. The capacitive DAC must exhibit high linearity, which depends on precise matching between the various capacitor elements. While increasing the area of unit capacitors can enhance matching, careful layout design is necessary to minimize systematic errors. In existing designs, the upper plates of each capacitor are connected through both horizontal and vertical metal lines, whereas the lower plates are connected only via vertical lines. This configuration leads to additional parasitic coupling between the upper and lower plates due to vertical connections, effectively increasing the unit capacitance value. The unintended increase can cause reference and input buffers to consume more power and may introduce systematic errors not proportional to the number of elements in the columns. These errors manifest as integral non-linearity (INL) and differential non-linearity (DNL), degrading the overall ADC performance.

FIG. 1 illustrates a known SAR ADC 10 designed to address some previously mentioned drawbacks in high-resolution analog-to-digital conversion. The SAR ADC 10 comprises a comparator 11, a sampling switch 12, a capacitive digital-to-analog converter (DAC) 13, and SAR logic 16. The comparator 11 has its inverting input connected to the output of the sampling switch 12, which samples the input voltage VIN. The non-inverting input of the comparator 11 is connected to the capacitive DAC 13. The output of the comparator 11 feeds into the SAR logic 16, which generates a control word to operate switches within the capacitive DAC 13.

The capacitive DAC 13 is structured around two primary nodes: a left-half node Nl and a right-half node Nr, separated by a bridge capacitor Cub. The right-half node Nr connects directly to the non-inverting input of the comparator 11. The DAC comprises two sets of switched capacitor circuits: 15(1) to 15(*m*) connected to Nr, and 14(1) to 14(*k*) connected to Nl. Each of these circuits contains either a unit capacitor Cu or multiples thereof (kCu or mCu), which can be switched between a reference voltage Vref and ground based on the control signals from the SAR logic 16.

To address parasitic coupling issues, the design incorporates two dummy capacitive elements: Cdr connected between node Nr and ground, and Cdl connected between node Nl and ground. As depicted in FIG. 3 (described below), these elements are actually columns of dummy capacitors vertically formed in a substrate that serve to isolate the terminals of the bridge capacitor Cub from the bottom of the capacitor kCu in 14(*k*) and the capacitor Cu in 15(0). This arrangement aims to mitigate the effects of parasitic capacitances Cp4 and Cp5, which represent the unintended capacitive coupling between the bridge capacitor and the switching nodes. By reducing this coupling, the design maintains better linearity during the successive approximation process, as the switching of capacitors on either side of bridge capacitor Cub could otherwise induce undesired voltage fluctuations across it.

FIG. 2 provides a top-down schematic view of the capacitor array layout in the capacitive DAC, illustrating the practical implementation of this design. The layout is organized in a grid-like structure, with each square element representing an individual unit capacitor. The central portion features the bridge capacitor Cub flanked by the dummy capacitors Cdl and Cdr. On either side are larger arrays of capacitors representing the switched capacitor circuits 14(1) to 14(*k*) and 15(1) to 15(*m*). This symmetric and regular arrangement is crucial for maintaining high linearity and minimizing mismatches in the DAC.

FIG. 3 provides a cross-sectional view of the layout, focusing on the arrangement of capacitor 14(*k*), capacitor Cdl, capacitor Cub, capacitor Cdr, and capacitor 15(1). This figure illustrates the complex interconnection scheme used in this prior art design. The capacitors are constructed using a multi-layer metal stack, for example comprised of six metal layers M1 to M6. Each capacitor element is formed by: M6, M2, and M1 forming the bottom plate, with a portion of M2 and M1, while M4, a portion of M5, and M3 form the top plate. The metal used for connecting all the top plates is an extension of the plate that forms the capacitance itself, ensuring that interconnections for the signals do not pass inside the single capacitor element.

In this configuration, the upper plates of the capacitors are connected by both horizontal and vertical metal lines that are extensions of the top plate itself, while the lower plates are connected by vertical lines in the sixth metal layer M6. This arrangement creates small parasitic capacitances between these metal layers, slightly increasing the unit capacitance value beyond the intended design. The most significant bit (MSB) capacitor of the lower array 14(*k*) of the switched capacitor circuits 14(1), . . . , 14(*k*) and the least significant bit (LSB) capacitor 15(1) of the upper array of the switched capacitor circuits 15(1), . . . , 15(*m*) are shown on either side of the central bridge capacitor Cub and dummy capacitors Cdl and Cdr, illustrating the symmetrical nature of the layout.

While this configuration effectively addresses the parasitic coupling issue, it comes at the cost of increased die area due to the additional dummy capacitor columns. Moreover, the interconnection scheme illustrated in FIG. 3 introduces its own set of parasitic capacitances Cp4 and Cp5, as described above.

As a consequence of these larger effective capacitances, the reference voltage source and input buffer must be designed to drive a larger equivalent capacitive load. This necessity leads to increased current consumption to meet the settling time specifications required for high-resolution operation. Thus, while this prior art design successfully addresses some issues, it still faces limitations in terms of area efficiency and power consumption, primarily due to its complex interconnection scheme and the extensive use of dummy capacitors.

Therefore, there is a need in the field of high-resolution analog-to-digital conversion for an improved capacitive SAR ADC design. Such a design should simultaneously address multiple challenges: minimizing noise and non-linearity, reducing die area occupation, and mitigating parasitic couplings. These improvements would collectively enhance ADC performance in demanding high-resolution applications, such as medical imaging, precision instrumentation, and high-speed communication systems, where signal integrity and conversion accuracy are paramount. Such a solution would aim to maintain or improve upon the speed, accuracy, and power efficiency that make SAR ADCs attractive, while overcoming the limitations of current designs in terms of area efficiency and parasitic effects. As such, further development is needed.

SUMMARY

A successive approximation register (SAR) analog-to-digital converter (ADC) includes a capacitive digital-to-analog converter (DAC) with a binary-weighted capacitor array. A bridge capacitor separates the binary-weighted capacitor array into a first switched capacitor array connected to a first node and a second switched capacitor array connected to a second node. The bridge capacitor has a first terminal connected to the first node and a second terminal connected to the second node. A multipurpose capacitor is connected to the first node, serving as both a termination capacitor for the first switched capacitor array and a shield between the first node and the bridge capacitor. A dummy capacitor is connected to the second node, serving as a shield between the second node and the bridge capacitor.

The capacitive DAC may have metal layers. The multipurpose capacitor and bridge capacitor may be formed by plates in second, third, fourth, fifth, and sixth metal layers.

The plates of the multipurpose capacitor and the bridge capacitor in the fifth and third metal layers may be connected to one another.

Upper plates of the bridge capacitor and the dummy capacitor may be connected by a horizontal plate in the sixth metal layer. The dummy capacitor may include a horizontal plate in the fifth metal layer connected to its horizontal plate in the sixth metal layer through a vertical line.

The dummy capacitor may be connected to a first capacitor of the second switched capacitor array. A horizontal plate in the fifth metal layer of the dummy capacitor may be connected to a corresponding horizontal plate in the fifth metal layer of the first capacitor.

The capacitive DAC may have a layout with the bridge capacitor centrally located, the multipurpose capacitor positioned adjacent to a first side of the bridge capacitor, the dummy capacitor positioned adjacent to a second side of the bridge capacitor, and the first and second switched capacitor arrays positioned on either side of the centrally located bridge capacitor.

The layout may include a tunnel created within a column containing the dummy capacitor, and a vertical metal line running through the tunnel to connect upper plates of capacitors across different columns of the binary-weighted capacitor array.

The vertical metal line may be formed in the fifth metal layer, and the tunnel may provide isolation between the vertical metal line and plates of capacitors.

Each of the first and second switched capacitor arrays may have multiple columns of capacitor elements. Each column of capacitor elements may be formed of multiple unit capacitors. Columns representing more significant bits may have a larger number of unit capacitors compared to columns representing less significant bits.

The capacitive DAC may have multiple metal layers. The multipurpose capacitor and bridge capacitor may be formed by conductive structures in at least three of the metal layers. At least two of the conductive structures of the multipurpose capacitor and the bridge capacitor in non-adjacent metal layers may be electrically connected to one another.

Upper conductive structures of the bridge capacitor and the dummy capacitor may be electrically connected in an uppermost metal layer. The dummy capacitor may include a conductive structure in a metal layer below the uppermost metal layer, electrically connected to the upper conductive structure through a vertical conductive element.

The dummy capacitor may be electrically connected to a first capacitor of the second switched capacitor array. A conductive structure of the dummy capacitor in a metal layer below the uppermost metal layer may be electrically connected to a corresponding conductive structure of the first capacitor in the same metal layer.

The SAR ADC may include a first calibration DAC connected to the first node, a second calibration DAC connected to the second node, and auto-calibration logic to control the first and second calibration DACs to inject error correction signals during analog-to-digital conversion.

The auto-calibration logic may evaluate capacitance errors for multiple most significant capacitors in the binary-weighted capacitor array and generate calibration coefficients based on the evaluated capacitance errors.

Evaluating the capacitance errors may involve sequentially testing each of the multiple most significant capacitors, taking N readings for each tested capacitor (where N is a positive integer), and calculating an error value for each tested capacitor based on the N readings.

The SAR ADC may include registers to store the generated calibration coefficients. The auto-calibration logic may apply the stored calibration coefficients as static corrections during subsequent analog-to-digital conversions.

The SAR ADC may include an ADC phase control circuit to enable the auto-calibration logic to perform calibration when the SAR ADC switches from an idle state to an operative state, and manage a sequence of calibration phases for evaluating errors in the most significant capacitors of the binary-weighted capacitor array.

The multiple most significant capacitors may include the nine most significant capacitors in the binary-weighted capacitor array.

DETAILED DESCRIPTION

The following disclosure enables a person skilled in the art to make and use the subject matter described herein. The general principles outlined in this disclosure can be applied to embodiments and applications other than those detailed above without departing from the spirit and scope of this disclosure. It is not intended to limit this disclosure to the embodiments shown, but to accord it the widest scope consistent with the principles and features disclosed or suggested herein.

Note that in the following description, any resistor or resistance mentioned is a discrete device, unless stated otherwise, and is not simply an electrical lead between two points. Therefore, any resistor or resistance connected between two points has a higher resistance than a lead between those two points, and such resistor or resistance cannot be interpreted as a lead. Similarly, any capacitor or capacitance mentioned is a discrete device, unless stated otherwise, and is not a parasitic element, unless stated otherwise. Additionally, any inductor or inductance mentioned is a discrete device, unless stated otherwise, and is not a parasitic element, unless stated otherwise.

Figure 2:
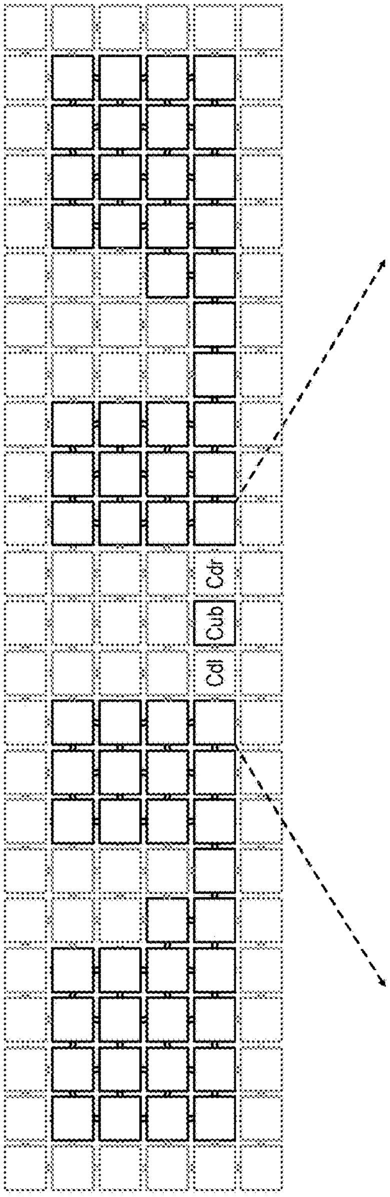
FIG. 2 (Prior Art)
FIG. 2 provides a top-down schematic view of the capacitor array layout in the prior art capacitive DAC of FIG. 1, demonstrating the arrangement of active and dummy capacitors.
Figure 3:
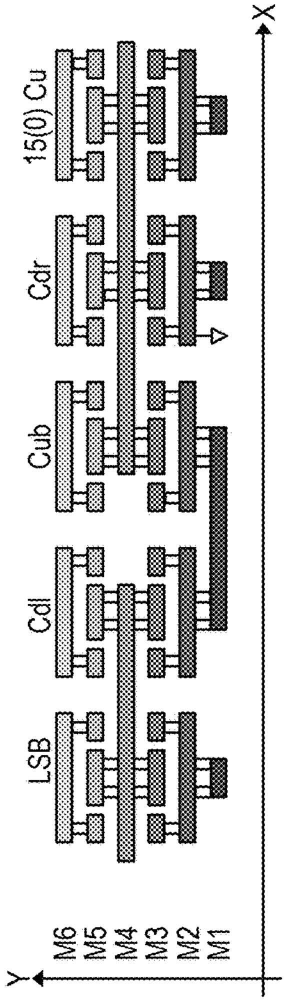
FIG. 3 (Prior Art)
FIG. 3 depicts a cross-sectional view of the prior art capacitor layout of FIG. 1, highlighting the metal layer arrangement and parasitic capacitances.
Figure 4:
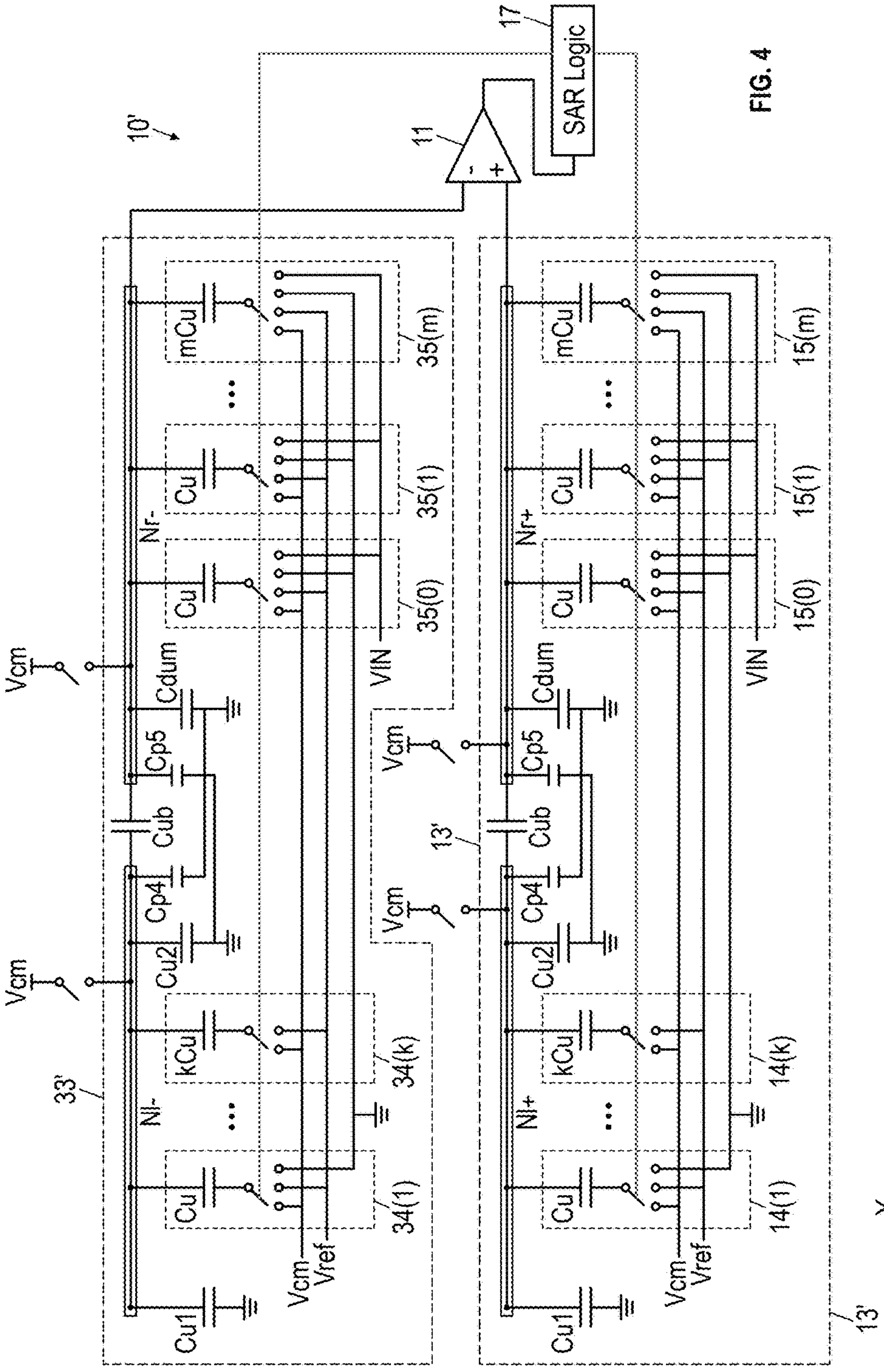
FIG. 4 presents the improved SAR ADC design disclosed herein, using a capacitor as both a termination capacitor and a shield, eliminating the need for separate dummy columns.

Now described with reference to FIG. 4 is a SAR ADC 10' that addresses the previously mentioned drawbacks of the design of FIGS. 2-3. The SAR ADC 10' comprises a fully differential architecture with two identical capacitive DACs, each connected to one input of a differential comparator 11. The SAR ADC 10' also includes SAR logic 16, similar to the described prior art designs. However, the capacitive DACs 13' and 33' in the SAR ADC 10' incorporates modifications to enhance performance and reduce area consumption.

Each capacitive DAC (13' and 33') includes a left-half node (Nl+ and Nl− respectively) and a right-half node (Nr+ and Nr− respectively), separated from each other and electrically coupled by a bridge capacitor Cub. The right-half nodes Nr+ and Nr− are connected to the non-inverting and inverting inputs of the comparator 11, respectively.

The DAC 13' comprises two sets of switched capacitor circuits: 15(1) to 15(*m*) connected to Nr+, and 14(1) to 14(*k*) connected to node Nl+. Likewise, the capacitive DAC 33' comprises two sets of switched capacitor circuit: 35(1) to 35(*m*) connected to Nr−, and 34(1) to 34(*k*) connected to Nl−.

Each of these circuits contains either a unit capacitor Cu or multiples thereof (kCu or mCu), which can be switched between a reference voltage Vref and ground based on the control signals from the SAR logic 16. In greater detail, the multiples may be in multiples of two; for example, if k=5, then the capacitor for 14(1) or 34(1) would have a capacitance of Cu, the capacitor for 14(2) or 34(2) would have a capacitance of 2Cu, the capacitor for 14(3) or 34(3) would have a capacitance of 4Cu, the capacitor for 14(4) or 34(4) would have a capacitance of 8Cu, and the capacitor for 14(*k*=5) or 34(*k*=5) would have a capacitance of 16Cu. Likewise, for m=5, then the capacitor for 15(1) or 35(1) would have a capacitance of Cu, the capacitor for 15(2) or 35(2) would have a capacitance of 2Cu, the capacitor for 15(3) or 35(3) would have a capacitance of 4Cu, the capacitor for 15(4) or 35(4) would have a capacitance of 8Cu, and the capacitor for 15(*m*=5) or 35(*m*=5) would have a capacitance of 16Cu.

Notable in this design is the use of capacitor Cu2 at the left-half node Nl+ of the capacitive DAC 13' and the use of capacitor Cu2 at the left-half node Nl− of the capacitive DAC 33'. Unlike in FIG. 1, where no such capacitor is present, these capacitors Cu2 in FIG. 4 serve multiple important functions—it can be considered a multipurpose capacitor. First, the form part of the binary-weighted capacitor arrays 14(1), . . . , 14(*k*) and 34(1), . . . , 34(*k*). In addition, these capacitors Cu2 act as ground-connected termination capacitors, they function as shields between the nodes Nl+, Nl− and the bridge capacitor Cub.

This multi-functional approach of capacitors Cu2 allows for the elimination of the separate dummy capacitor column (Cdl in FIG. 1) while still maintaining the necessary shielding effect. In the prior art design of FIG. 1, dummy capacitor column Cdl served solely as a shielding element, occupying valuable chip area. By repurposing capacitor Cu2, an existing and necessary component of the binary-weighted DAC structure, to also serve as a shield, the new design achieves improved area efficiency without compromising functionality.

At the right-side nodes Nr+, Nr− single dummy capacitors Cdum are retained in each DAC, similar to the prior art design showing capacitor Cdr. These dummy capacitors ensure proper shielding for the right side of the bridge capacitors Cub and maintain symmetry in the overall DAC structures.

Figure 1:
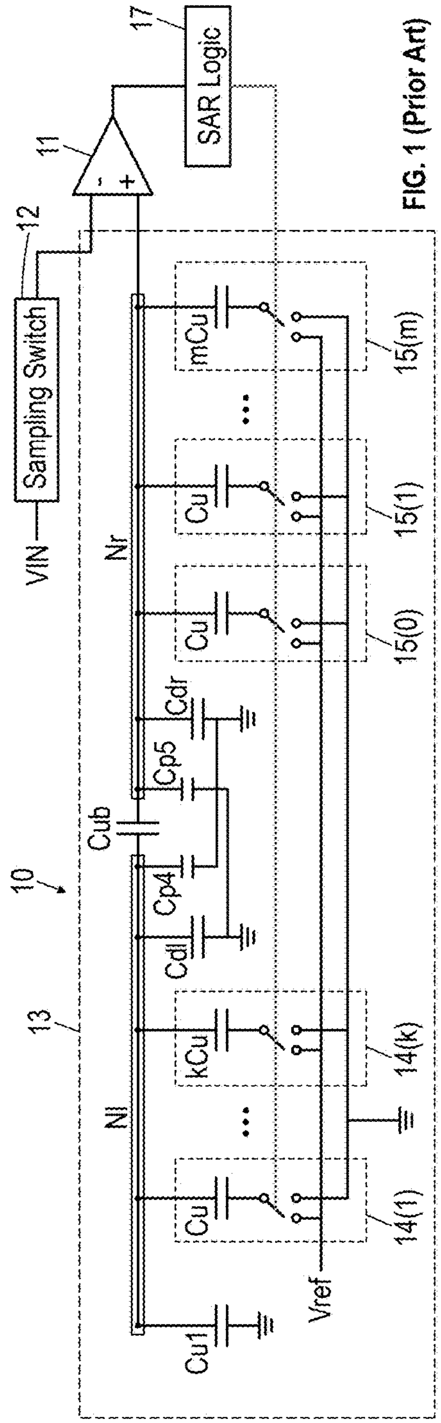
FIG. 1 (Prior Art)
FIG. 1 illustrates a prior art SAR ADC design, showing the basic structure with separate dummy capacitor columns for shielding.

This configuration effectively addresses the parasitic coupling issues while significantly reducing the overall area of the DACs compared to the prior art design in FIG. 1. By eliminating the need for separate dummy columns on both sides of the bridge capacitor (as seen with dummy capacitor columns Cdl and Cdr in FIGS. 1-3), this design achieves considerable area savings, particularly in this fully differential ADC with separate DACs for inverting and non-inverting signal paths.

Figure 5:
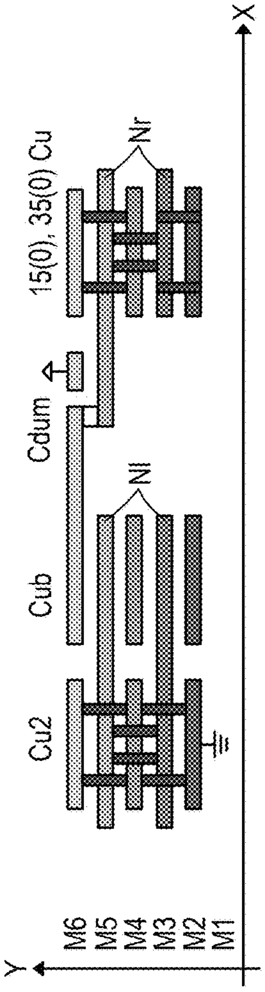
FIG. 5 shows the metal layer arrangement of the improved design of FIG. 4, illustrating how the interconnection scheme reduces parasitic capacitances.

FIG. 5 illustrates the metal layer arrangement of the improved design. Cu2 is repurposed from the binary-weighted capacitor array to also function as a shield. The most significant bit capacitor 14(*k*) is not explicitly shown in this figure. The interconnection scheme has been optimized to reduce parasitic capacitances. The lower plates of the capacitors are connected primarily by vertical metal lines in the sixth metal layer M6, while the upper plates are connected by horizontal lines in metal layer M3 and M5. This arrangement minimizes the overlap between different metal layers, thereby reducing unwanted parasitic capacitances.

This approach achieves the same shielding effect as the previous design, with the parasitic capacitances Cp4 and Cp5 still referred to a fixed potential. Consequently, the switching of capacitances to the right and left of the bridge capacitor does not induce undesired voltage fluctuations on the floating electrodes. The result is a more area-efficient design that maintains the linearity and performance benefits of the previous approach.

By eliminating the need for multiple dummy columns (four in the case of a fully differential ADC with separate DACs for the main conversion and mismatch calibration), this design achieves considerable area savings. The dual use of capacitor Cu2 as a shield reduces the capacitor count without compromising functionality or the binary-weighted structure of the DACs 13' and 33'. The retention of capacitor Cdum on the right side provides for balanced operation while minimizing additional area requirements.

This reduction in area not only improves the overall efficiency of the ADC 10' but also potentially reduces manufacturing costs and power consumption, making it particularly suitable for high-resolution applications where space and power are at a premium.

Figure 6:
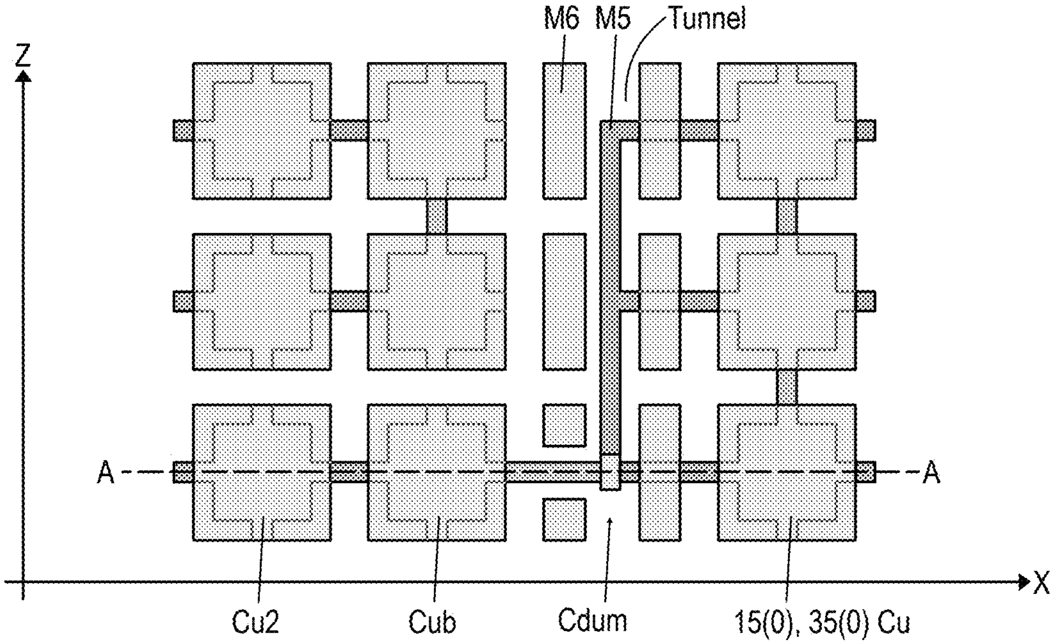
FIG. 6 offers a top view of the capacitor layout in the design of FIG. 4, showing the modified dummy column that creates a tunnel for the M5 vertical line, improving linearity.

FIG. 6 provides a top-down view of the 3D structure that FIG. 5 shows in cross section top view of the capacitor layout of the DACs 13' and 33', showcasing the compact arrangement of the capacitor elements of the DAC 13' and 33'; stated another way, FIG. 5 shows a cross sectional view of FIG. 6 taken along line A-A. The bridge capacitor Cub is shown in the center, flanked by the termination capacitor Cu2 on the left and the dummy capacitor Cdum on the right. The active switched capacitor arrays are positioned on either side of this central structure.

This design addresses the problem of parasitic paths as follows. The horizontal lines of M5 and M3, which form the upper plates of the capacitors and are shorted to each other, connect the upper part of each unitary element. These do not pair with the vertical lines of M6 and M4, which form the lower plates of the capacitors (also shorted) and connect the lower parts of the elements in the same column. By eliminating vertical M5/M3 lines running alongside M6, this arrangement significantly reduces parasitic couplings compared to the prior art design described in the background.

The reduction in parasitic couplings offers several advantages. It allows for lower power consumption in the drivers and reduces mismatches between various parasitic elements. By decreasing the absolute value of these parasitic elements, their contribution to mismatch due to technology variations is proportionally reduced, even with the same level of process mismatch.

A single vertical line of M5 is used to connect the top of elements across different columns.

As shown in FIG. 6, a tunnel is created within the dummy column for the M5 vertical line to run through. This helps ensure that the M5 line no longer runs adjacent to the bottom of the capacitance column tied to capacitor mCu.

In the DACs 13' and 33', a column tied to capacitor mCu is formed of 8 elements of, for example, 40 fF each, for a total expected capacitance of for example 320 fF. As a result, the capacitance values of all MSB columns are consistent, improving the linearity of the DAC.

Figure 7:
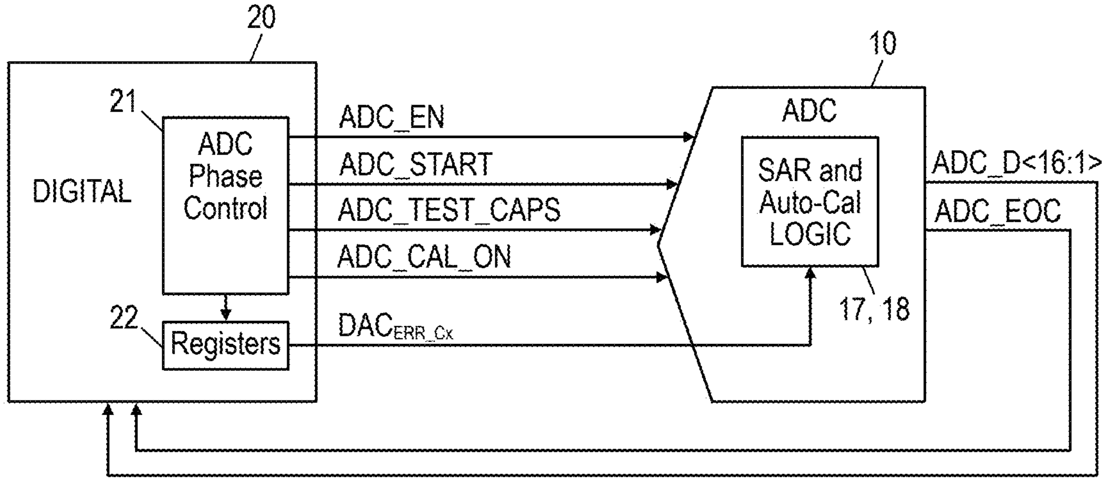
FIG. 7 illustrates a block diagram of a complete ADC system, including the ADC disclosed herein and the digital blocks necessary for implementing a self-calibration technique disclosed herein.

FIG. 7 illustrates a block diagram of the ADC system designed for use in medical applications desiring low-power, high-resolution analog-to-digital conversion. The ADC system is divided into two main blocks: the ADC 10 and the digital block 20.

The ADC 10 represents the analog-to-digital converter described above. It contains the SAR logic 16, which implements the successive approximation register algorithm used the operation of the ADC 10. The SAR logic 16 controls the conversion process and interacts with other parts of the system. The ADC 10 outputs two signals: ADC_D<16:1>, which is the 16-bit digital output representing the converted analog input, and ADC_EOC, indicating the end of conversion when the ADC 10 completes a conversion cycle.

The digital block 20 includes the digital control and processing elements used for the ADC operation and calibration. Within this digital block 20, the ADC Phase Control 21 manages the overall operation of the ADC. It generates several control signals: ADC_EN to enable or disable the ADC 10, ADC_START to initiate a conversion cycle, and ADC_TEST_CAPS used for testing the capacitors in the ADC 10' as part of the calibration process. The ADC Phase Control 21 also generates ADC_CAL_On to enable the auto-cal logic 18. The digital block 20 also includes registers 22 that store calibration coefficients and other data for the operation of the ADC. These registers 22 are updated during a self-calibration process described hereinbelow to correct for non-linearity errors in the ADC 10.

The digital block 20 receives the ADC_D<16:1> and ADC_EOC signals from the ADC 10', using them for processing and coordinating the operation of the ADC 10'. The digital block 20 outputs the DAC_ERR_Cx signal, which represents the calibration coefficients sent to the ADC 10 to correct for nonlinearity errors in the capacitive DACs 13 and 33". To achieve the high level of linearity required for a high Effective Number of Bits (ENOB), such as 14-bits, an Auto-Calibration technique described hereinbelow has been implemented. This technique compensates for both DAC and comparator non-linearity, enabling the ADC to achieve an ENOB of up to 14 bits.

The Auto-Calibration process evaluates the calibration coefficients, which are then stored in the registers 22. This calibration is performed automatically each time the device switches from the idle state to the operative state. By doing so, the system corrects for aging effects and slow temperature variations without the need for manual intervention or increased testing time. This approach not only maintains the ADC's high performance over time but also keeps operational costs low by eliminating the need for frequent manual calibrations.

By incorporating this self-calibration mechanism, the ADC 10 can achieve the desired Signal-to-Noise and Distortion Ratio (SNDR) for high-resolution performance, overcoming the limitations of relying solely on accurate capacitive DAC layout. This design approach is particularly suitable for medical applications that demand both low power consumption and high resolution in analog-to-digital conversion. The ability to automatically compensate for various factors that could degrade performance over time makes this ADC system especially valuable in medical devices where consistent, high-accuracy measurements are desired.

Figure 8:
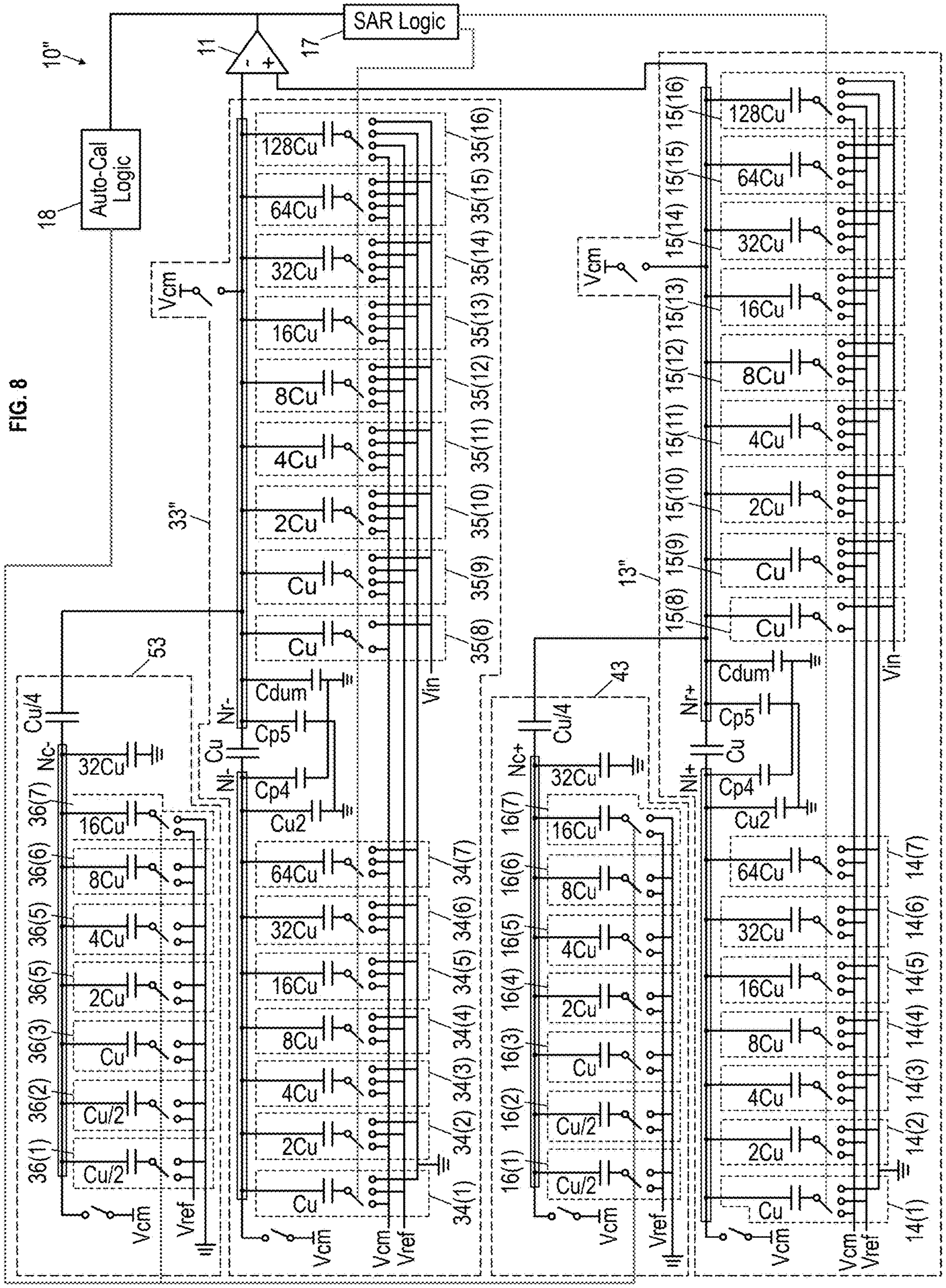
FIG. 8 is a schematic diagram of the ADC including calibration functionality, showing the main DACs and the calibration DACs.

An example implementation of the ADC 10" including calibration functionality is now described with reference to FIG. 8. The ADC 10" comprises a fully differential architecture with four capacitive DACs: main DACs 13", 33" and two calibration DACs 43 and 53.

The first main DAC 13" includes a left-half node Nl+ and a right-half node Nr+, separated from each other and electrically coupled by a bridge capacitor Cu. The right-half node Nr+ is connected to the non-inverting input of the comparator. A first set of switched capacitor circuits 14(1) to 14(7) is connected to Nl+ and a second set of switched capacitor circuits 15(8) to 15(16) is connected to Nr+. Each of these circuits contains a binary-weighted capacitor array, with capacitances in 14(1) to 14(7) ranging from Cu to 64Cu, and with capacitances in 15(8) to 15(16) ranging from Cu to 128Cu. Each capacitor in switched capacitor circuits 14(1) to 14(7) can be switched between being connected to a common mode voltage Vcm, a reference voltage Vref, and ground. Each capacitor in switched capacitor circuits 15(1) to 15(7) can be switched between being connected to a common mode voltage Vcm, a reference voltage Vref, ground, and the input voltage Vin.

The second main DAC 33" includes a left-half node Nl- and a right-half node Nr−, separated from each other and electrically coupled by a bridge capacitor Cu. The right-half node Nr− is connected to the inverting input of the comparator. A first set of switched capacitor circuits 34(1) to 34(7) is connected to Nl− and a second set of switched capacitor circuits 35(8) to 35(16) is connected to Nr−. Each of these circuits contains a binary-weighted capacitor array, with capacitances in 34(1) to 34(7) ranging from Cu to 64Cu, and with capacitances in 35(8) to 35(16) ranging from Cu to 128Cu. Each capacitor in switched capacitor circuits 34(1) to 34(7) can be switched between being connected to a common mode voltage Vcm, a reference voltage Vref, and ground. Each capacitor in switched capacitor circuits 35(1) to 35(7) can be switched between being connected to a common mode voltage Vcm, a reference voltage Vref, ground, and the input voltage Vin.

The first calibration DAC 43 is connected to node Nc+, and includes a series of switched capacitor circuits 16(1) to 16(7), with capacitances ranging from Cu/2 to 16Cu. A termination capacitor having a capacitance of 32Cu is connected between node Nc+ and ground. An additional capacitor Cu/4 is connected between node Nc+ and node Nr+. Each capacitor in the capacitor circuits 16(1) to 16(7) can be switched between a reference voltage Vref and ground.

The second calibration DAC 53 is connected to node Nc−, and includes a series of switched capacitor circuits 36(1) to 36(7), with capacitances ranging from Cu/2 to 16Cu. A termination capacitor having a capacitance of 32Cu is connected between node Nc− and ground. An additional capacitor Cu/4 is connected between node Nc− and node Nr−. Each capacitor in the capacitor circuits 36(1) to 36(7) can be switched between a reference voltage Vref and ground.

The ADC 10" also includes a comparator 11 that receives inputs from the right-half nodes Nr+ and Nr− of the main DACs 13" and 33". The output of the comparator 11 feeds into the SAR logic 17, which generates control signals for the switched capacitor circuits in the main DACs 13" and 33". An Auto-Cal Logic block 18 also receives the output of the comparator 11 and generated control signals for the switched capacitor circuits in the calibration DACs 43 and 53.

The calibration workflow will now be described, but first note that the following notations will be used.

In the main DAC 13", the capacitor in 14(1) will be referred to as capacitor C1*p* (having a capacitance of Cu), the capacitor in 14(2) will be referred to as capacitor C2*p* (having a capacitance of 2Cu), the capacitor in 14(3) will be referred to as capacitor C3*p* (having a capacitance of 4Cu), the capacitor in 14(4) will be referred to as capacitor C4*p* (having a capacitance of 8Cu), the capacitor in 14(5) will be referred to as capacitor C5*p* (having a capacitance of 16Cu), the capacitor in 14(6) will be referred to as capacitor C6*p* (having a capacitance of 32Cu), the capacitor in 14(7) will be referred to as capacitor C7*p* (having a capacitance of 64Cu), the capacitor in 15(8) will be referred to as capacitor C8*p* (having a capacitance of Cu), the capacitor in 15(9) will be referred to as capacitor C9*p* (having a capacitance of Cu), the capacitor in 15(10) will be referred to as capacitor C10*p* (having a capacitance of 2Cu), the capacitor in 15(11) will be referred to as capacitor C11*p* (having a capacitance of 4Cu), the capacitor in 15(12) will be referred to as capacitor C12*p* (having a capacitance of 8Cu), the capacitor in 15(13) will be referred to as capacitor C13*p* (having a capacitance of 16Cu), the capacitor in 15(14) will be referred to as capacitor C14*p* (having a capacitance of 32Cu), the capacitor in 15(15) will be referred to as capacitor C15*p* (having a capacitance of 64Cu), and the capacitor in 15(16) will be referred to as capacitor C16*p* (having a capacitance of 128Cu).

In the main DAC 33", the capacitor in 34(1) will be referred to as capacitor C1*n* (having a capacitance of Cu), the capacitor in 34(2) will be referred to as capacitor C2*n* (having a capacitance of 2Cu), the capacitor in 34(3) will be referred to as capacitor C3*n* (having a capacitance of 4Cu), the capacitor in 34(4) will be referred to as capacitor C4*n* (having a capacitance of 8Cu), the capacitor in 34(5) will be referred to as capacitor C5*n* (having a capacitance of 16Cu), the capacitor in 34(6) will be referred to as capacitor C6*n* (having a capacitance of 32Cu), the capacitor in 34(7) will be referred to as capacitor C7*n* (having a capacitance of 64Cu), the capacitor in 35(8) will be referred to as capacitor C8*n* (having a capacitance of Cu), the capacitor in 35(9) will be referred to as capacitor C9*n* (having a capacitance of Cu), the capacitor in 35(10) will be referred to as capacitor C10*n* (having a capacitance of 2Cu), the capacitor in 35(11) will be referred to as capacitor C11*n* (having a capacitance of 4Cu), the capacitor in 35(12) will be referred to as capacitor C12*n* (having a capacitance of 8Cu), the capacitor in 35(13) will be referred to as capacitor C13*n* (having a capacitance of 16Cu), the capacitor in 35(14) will be referred to as capacitor C14*n* (having a capacitance of 32Cu), the capacitor in 35(15) will be referred to as capacitor C15*n* (having a capacitance of 64Cu), and the capacitor in 35(16) will be referred to as capacitor C16*n* (having a capacitance of 128Cu).

Figure 9:
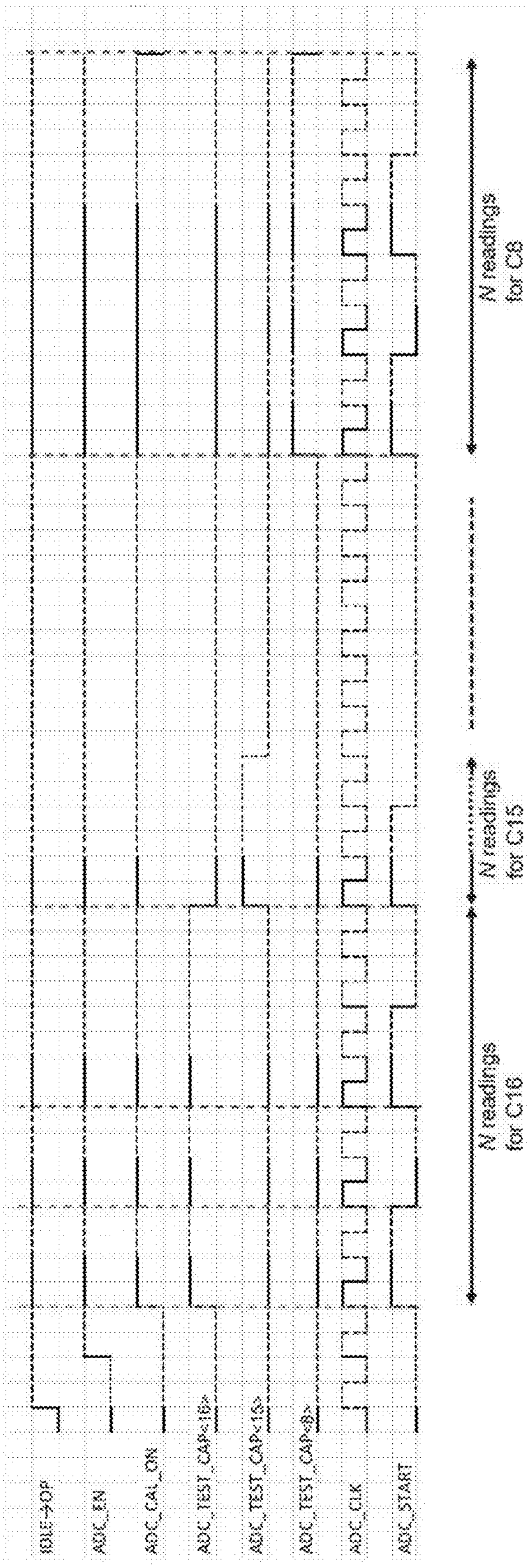
FIG. 9 is a timing diagram illustrating the calibration workflow managed by the ADC phase control block, showing the sequence of calibration phases.

The calibration workflow is managed by the ADC phase control block 21 (see FIG. 7), which enables the SAR logic 17 and auto-cal logic 18 in specific phases, as illustrated in the timing diagram of FIG. 9. The calibration process focuses on evaluating and correcting errors in the most significant capacitances, namely C16*p* to C8*p* in the positive array (DAC 13") and C16*n* to C8*n* in the negative array (DAC 33"), as these have the greatest impact on nonlinearity errors.

After calibration is enabled, the error evaluation proceeds through a series of phases: ADC_TEST_CAP<16>, ADC_TEST_CAP<15>, ADC_TEST_CAP<14>, ADC_TEST_CAP<13>, ADC_TEST_CAP<12>, ADC_TEST_CAP<11>, ADC_TEST_CAP<10>, ADC_TEST_CAP<9>, and ADC_TEST_CAP<8>. During each of these phases, N readings (for example, N=8) are taken for the respective capacitance being evaluated.

The behavior of voltages across the capacitors in both the positive and negative arrays during these calibration phases is illustrated in FIGS. 10 through 14. These figures show the trend of voltages V_C1_*p* to V_C16_*p* across capacitors C1*p* to C16*p* in the positive array, and voltages V_C1_*n* to V_C16_*n* across capacitors C1*n* to C16*n* in the negative array.

Figure 10:
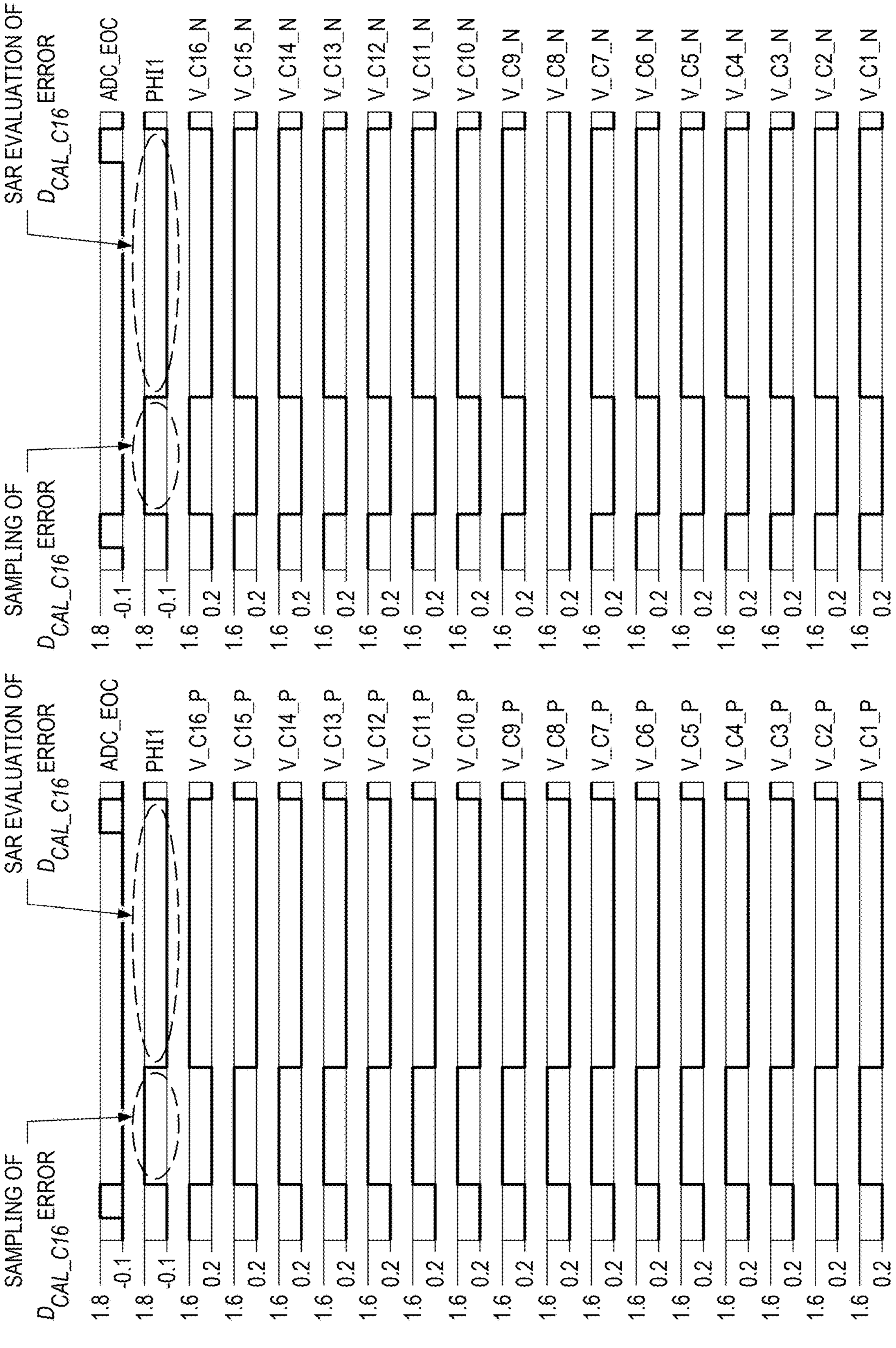
FIG. 10 shows the drive signals for both the positive and negative arrays during the calibration phase for evaluating the C16 capacitance error.
Figure 11:
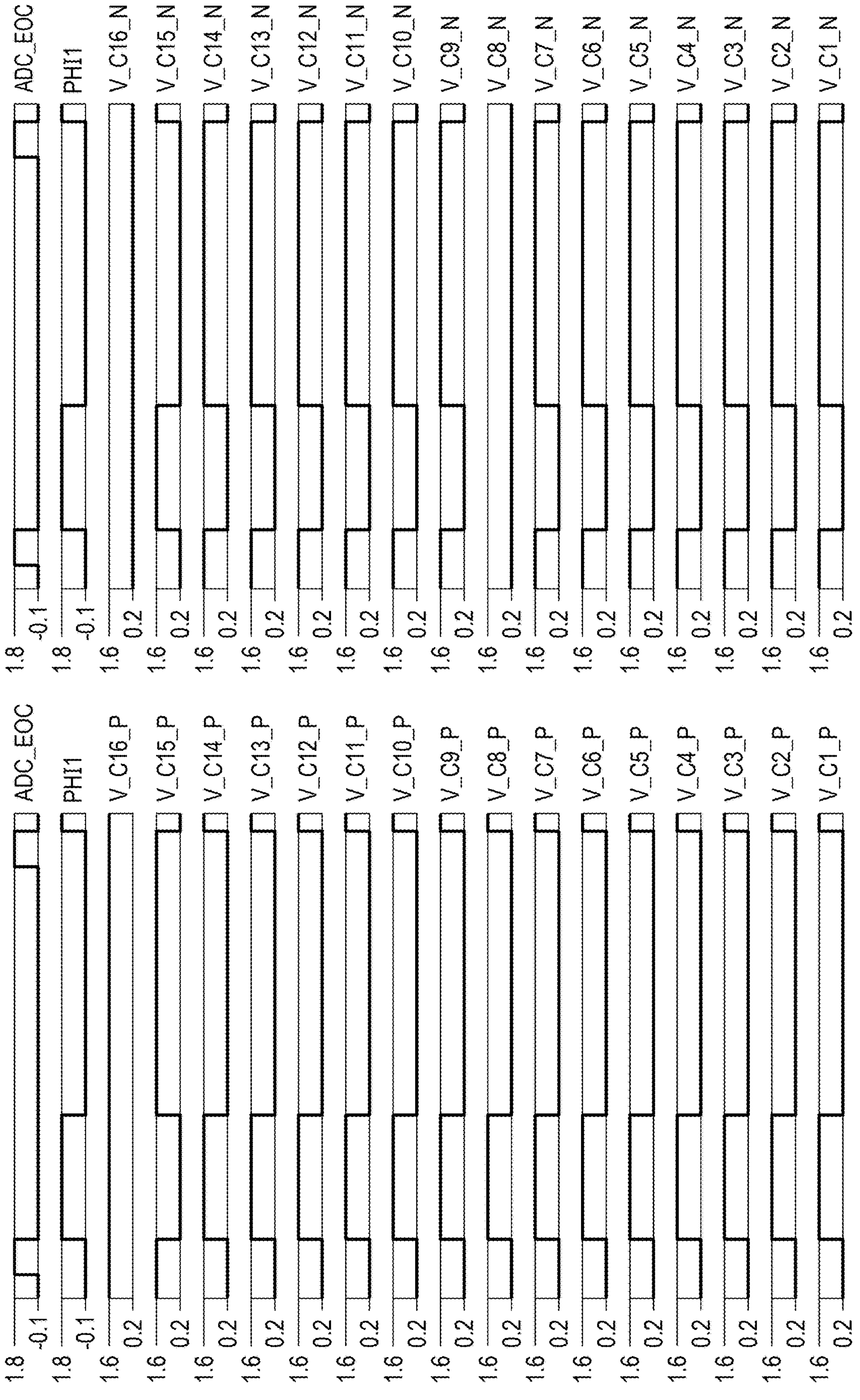
FIG. 11 illustrates the drive signals for the positive and negative arrays during the calibration phase for evaluating the C15 capacitance error.
Figure 12:
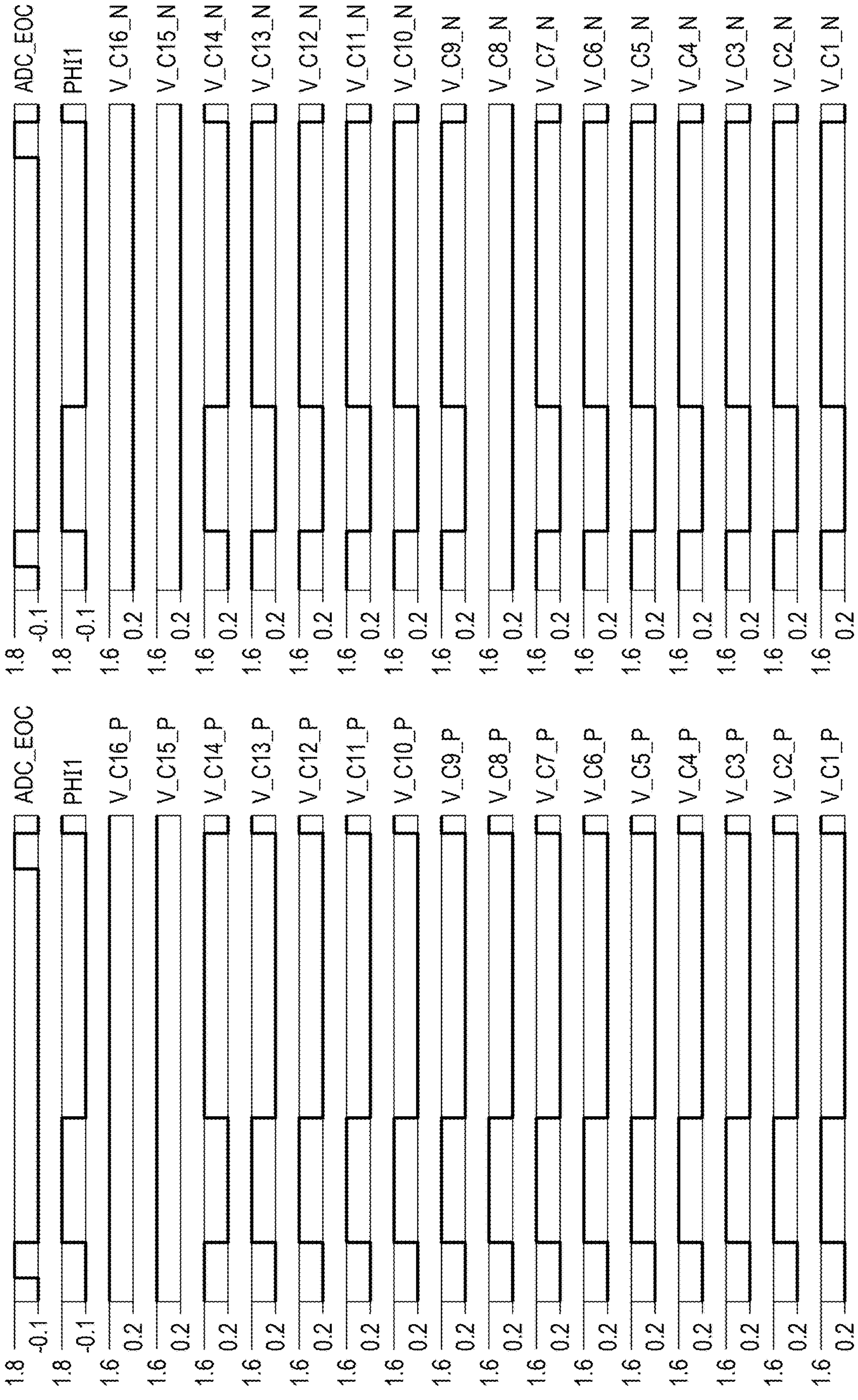
FIG. 12 depicts the drive signals for the positive and negative arrays during the calibration phase for evaluating the C14 capacitance error.
Figure 13:
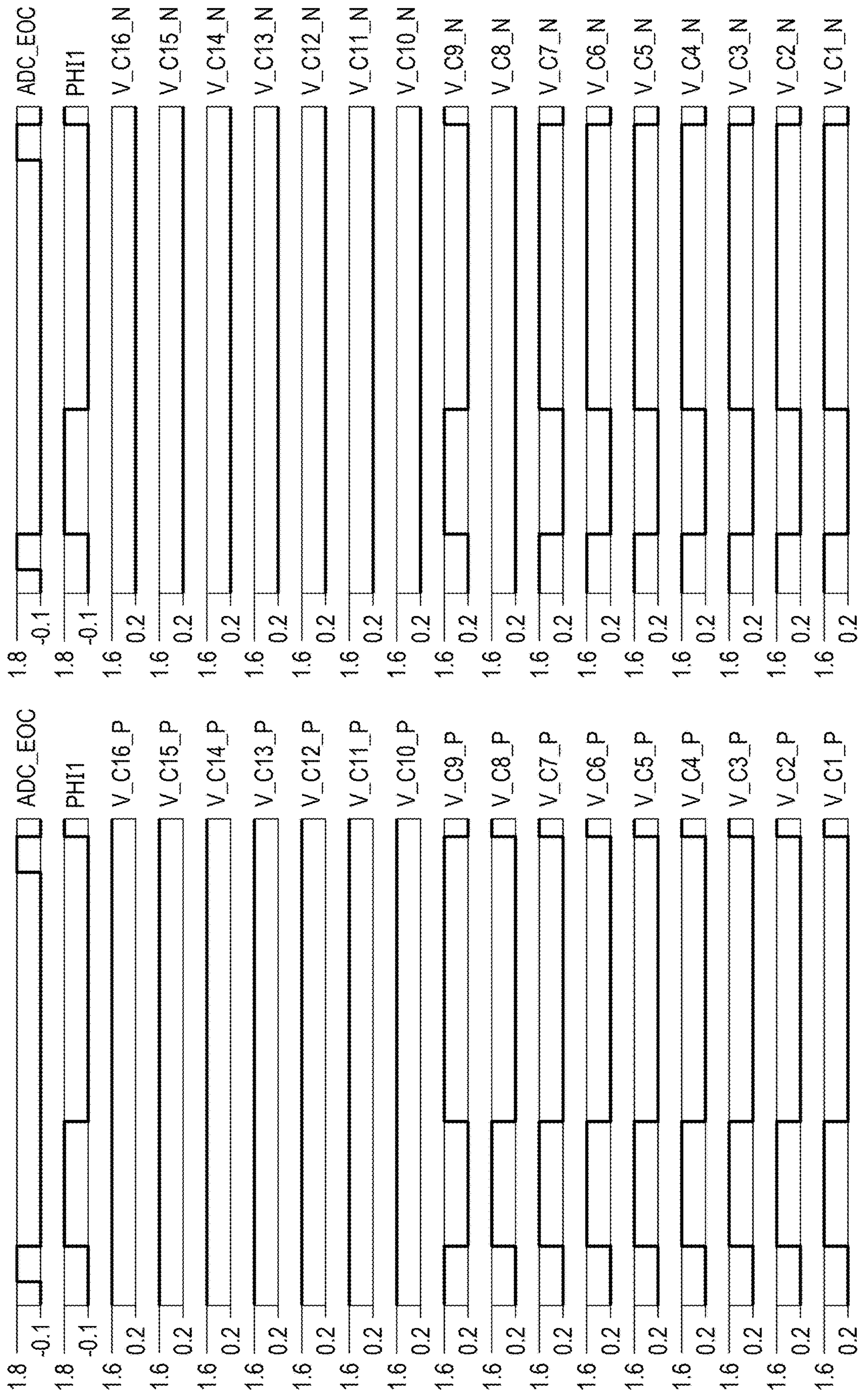
FIG. 13 shows the drive signals for the positive and negative arrays during the calibration phase for evaluating the C9 capacitance error.
Figure 14:
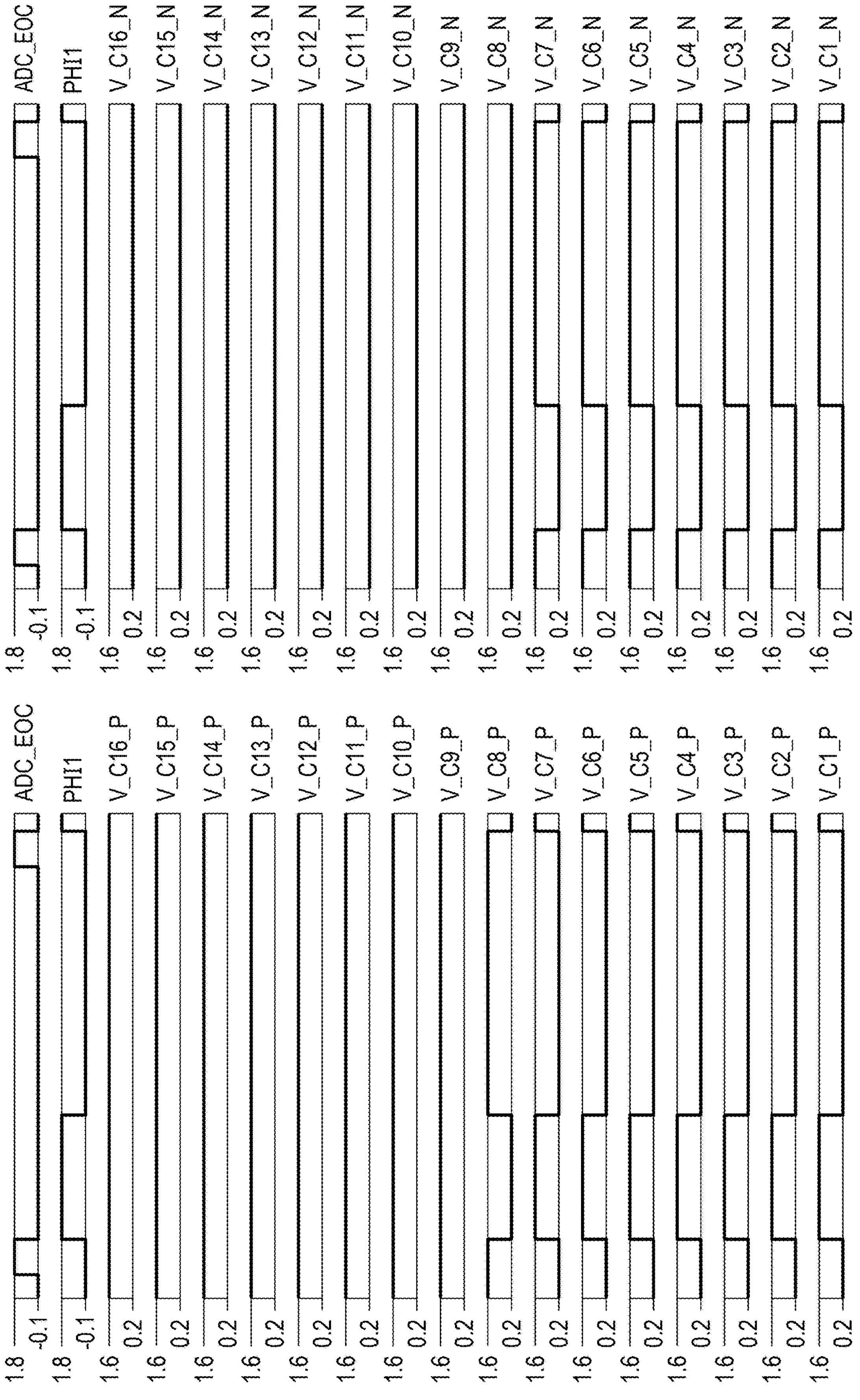
FIG. 14 illustrates the drive signals for the positive and negative arrays during the calibration phase for evaluating the C8 capacitance error.

FIG. 10 depicts the evaluation of the C16 capacitance error. It shows the drive signals for both the positive array (left) and negative array (right) during the calibration phase ADC_TEST_CAP<16>. Likewise, FIG. 11 shows the evaluation of the C15 capacitance error, showing the drive signals for the positive array (left) and negative array (right) during the calibration phase ADC_TEST_CAP<15>. Additionally, FIG. 12 shows the evaluation of the C14 capacitance error, showing the drive signals for the positive array (left) and negative array (right) during the calibration phase ADC_TEST_CAP<14>. Moreover, FIG. 13 shows the evaluation of the C9 capacitance error, presenting the drive signals for the positive array (left) and negative array (right) during the calibration phase ADC_TEST_CAP<9>. Furthermore, FIG. 14 shows the evaluation of the C8 capacitance error, showing the drive signals for the positive array (left) and negative array (right) during the calibration phase ADC_TEST_CAP<8>.

Driving the capacitances according to the waveforms shown in FIGS. 10-14, the equations showing the evaluation of the error are as follows:

$$DCAL_{C16} \cong -\frac{((C16p + C16n) - (C15p + C15n) - (C14p + C14n) - (C13p + C13n) - (C12p + C12n)) \cdot \Delta Vref}{CDAC_{Upper}} - \frac{(-(C11p + C11n) - (C10p + C10n) - (C9p + C9n) - C8p - (C7p, eq + C7n, eq)) \cdot \Delta Vref}{CDAC_{Upper}}$$

$$DCAL_{C15} \cong -\frac{((C15p + C15n) - (C14p + C14n) - (C13p + C13n) - (C12p + C12n)) \cdot \Delta Vref}{CDAC_{Upper}} - \frac{(-(C11p + C11n) - (C10p + C10n) - (C9p + C9n) - C8p - (C7p, eq + C7n, eq)) \cdot \Delta Vref}{CDAC_{Upper}}$$

$$DCAL_{C14} \cong -\frac{((C14p + C14n) - (C13p + C13n) - (C12p + C12n)) \cdot \Delta Vref}{CDAC_{Upper}} - \frac{(-(C11p + C11n) - (C10p + C10n) - (C9p + C9n) - C8p - (C7p, eq + C7n, eq)) \cdot \Delta Vref}{CDAC_{Upper}}$$

$$DCAL_{C13} \cong -\frac{((C13p + C13n) - (C12p + C12n)) \cdot \Delta Vref}{CDAC_{Upper}} - \frac{(-(C11p + C11n) - (C10p + C10n) - (C9p + C9n) - C8p - (C7p, eq + C7n, eq)) \cdot \Delta Vref}{CDAC_{Upper}}$$

$$DCAL_{C12} \cong -\frac{((C12p + C12n)) \cdot \Delta Vref}{CDAC_{Upper}} - \frac{((C11p + C11n) - (C10p + C10n) - (C9p + C9n) - C8p - (C7p, eq + C7n, eq)) \cdot \Delta Vref}{CDAC_{Upper}}$$

$$DCAL_{C11} \cong -\frac{((C11p + C11n) - (C10p + C10n) - (C9p + C9n) - C8p - (C7p, eq + C7n, eq)) \cdot \Delta Vref}{CDAC_{Upper}}$$

$$DCAL_{C10} \cong -\frac{((C10p + C10n) - (C9p + C9n) - C8p - (C7p, eq + C7n, eq)) \cdot \Delta Vref}{CDAC_{Upper}}$$

$$DCAL_{C9} \cong -\frac{((C9p + C9n) - C8p - (C7p, eq + C7n, eq)) \cdot \Delta Vref}{CDAC_{Upper}}$$

$$DCAL_{C8} \cong -\frac{(C8p - (C7p, eq + C7n, eq)) \cdot \Delta Vref}{CDAC_{Upper}}$$

where:

$$(C16p + C15p + C14p + C13p + C12p + C11p + C10p + C9p + C8p) + Cu + Ccomp, p$$
$$\cong (C16n + C15n + C14n + C13n + C12n + C11n + C10n + C9n + C8n) + Cu + Ccomp, n$$
$$\cong CDAC_{Upper}$$

$$\Delta C7p, eq \cong \frac{((1/2\,Cu) \cdot \Delta Vref)}{(C16p + C15p + C14p + C13p + C12p + C11p + C10p + C9p + C8p) + Cu + Ccomp, p}$$

$$\Delta C7n, eq \cong \frac{(-(1/2\,Cu) \cdot \Delta Vref)}{(C16n + C15n + C14n + C13n + C12n + C11n + C10n + C9n + C8n) + Cu + Ccomp, n}$$

$$C7p, eq \cong C7n, eq \cong 1/2\,Cu$$

A specific example will now be provided. Suppose the following errors are to be calibrated: (C16$p$+C16$n$)=128Cu+128Cu+2·ΔC=256Cu+2·ΔC $$(C15p + C15n) = 64Cu + 64Cu - 1 \cdot \Delta C = 128Cu - 1 \cdot \Delta C$$
$$(C14p + C14n) = 32Cu + 32Cu + 0 \cdot \Delta C = 64Cu + 0 \cdot \Delta C$$
$$(C13p + C13n) = 16Cu + 16Cu + 1 \cdot \Delta C = 32Cu + 1 \cdot \Delta C$$
$$(C12p + C12n) = 8Cu + 8Cu - 1 \cdot \Delta C = 16Cu - 1 \cdot \Delta C$$

-continued $$(C11p + C11n) = 4Cu + 4Cu - 2 \cdot \Delta C = 8Cu - 2 \cdot \Delta C$$
$$(C10p + C10n) = 2Cu + 2Cu - 3 \cdot \Delta C = 4Cu - 3 \cdot \Delta C$$
$$(C9p + C9n) = 1Cu + 1Cu + 1 \cdot \Delta C = 2Cu + 1 \cdot \Delta C$$
$$C8p = 1Cu + 2 \cdot \Delta C$$
$$(C7p, eq + C7n, eq) = 1Cu + 0 \cdot \Delta C$$

The calibration values DCAL resulting from the calibration then become:

$$DCAL, C16 = -\frac{((2 - (-1 + 0 + 2 - 1 - 2 - 3 + 1 + 2 + 0) \cdot \Delta C) \cdot \Delta Vref}{CDAC_{Upper}} = \frac{\Delta Vref}{CDAC_{Upper}}(-4 \cdot \Delta C)$$

$$DCAL, C15 = -\frac{((-1 - (0 + 2 - 1 - 2 - 3 + 1 + 2 + 0)) \cdot \Delta C) \cdot \Delta Vref}{CDAC_{Upper}} = \frac{\Delta Vref}{CDAC_{Upper}}(0 \cdot \Delta C)$$

$$DCAL, C14 = -\frac{((0 - (2 - 1 - 2 - 3 + 1 + 2 + 0)) \cdot \Delta C) \cdot \Delta Vref}{CDAC_{Upper}} = \frac{\Delta Vref}{CDAC_{Upper}}(-1 \cdot \Delta C) DCAL, C13$$

-continued $$= -\frac{((2-(-1-2-3+1+2+0))\cdot\Delta C)\cdot\Delta Vref}{CDAC_{Upper}} = \frac{\Delta Vref}{CDAC_{Upper}}(-5\cdot\Delta C)DCAL,\ C12$$

$$= -\frac{((-1-(-2-3+1+2+0))\cdot\Delta C)\cdot\Delta Vref}{CDAC_{Upper}} = \frac{\Delta Vref}{CDAC_{Upper}}(-1\cdot\Delta C)$$

$$DCAL,\ C11 = -\frac{((-2-(-3+1+2+0))\cdot\Delta C)\cdot\Delta Vref}{CDAC_{Upper}} = \frac{\Delta Vref}{CDAC_{Upper}}(2\cdot\Delta C)$$

$$DCAL,\ C10 = -\frac{((-3-(1+2+0))\cdot\Delta C)\cdot\Delta Vref}{CDAC_{Upper}} = \frac{\Delta Vref}{CDAC_{Upper}}(6\cdot\Delta C)$$

$$DCAL,\ C9 = -\frac{((1-(2+0))\cdot\Delta C)\cdot\Delta Vref}{CDAC_{Upper}} = \frac{\Delta Vref}{CDAC_{Upper}}(1\cdot\Delta C)$$

$$DCAL,\ C8 = -\frac{((2-(0))\cdot\Delta C)\cdot\Delta Vref}{CDAC_{Upper}} = \frac{\Delta Vref}{CDAC_{Upper}}(-2\cdot\Delta C)$$

From these DCAL values, the capacitance errors can be calculated as:

$$\text{DACerr\_C16} \cong \frac{1}{2}\cdot(-DCAL,\ C16)$$

$$\text{DACerr\_C15} \cong \frac{1}{2}\cdot(-DCAL,\ C15 - \text{DACerr\_C16})$$

$$\text{DACerr\_C14} \cong \frac{1}{2}\cdot(-DCAL,\ C14 - \text{DACerr\_C15} - \text{DACerr\_C16})$$

$$\text{DACerr\_C13} \cong \frac{1}{2}\cdot(-DCAL,\ C13 - \text{DACerr\_C14} - \text{DACerr\_C15} - \text{DACerr\_C16})$$

$$\text{DACerr\_C12} \cong \frac{1}{2}\cdot(-DCAL,\ C12 - \text{DACerr\_C13} - \text{DACerr\_C14} - \text{DACerr\_C15} - \text{DACerr\_C16})$$

$$\text{DACerr\_C11} \cong \frac{1}{2}\cdot(-DCAL,\ C11 - \text{DACerr\_C12} - \text{DACerr\_C13} - \text{DACerr\_C14} - \text{DACerr\_C15} - \text{DACerr\_C16})$$

$$\text{DACerr\_C10} \cong \frac{1}{2}\cdot(-DCAL,\ C10 - \text{DACerr\_C11} - \text{DACerr\_C12} - \text{DACerr\_C13} - \text{DACerr\_C14} - \text{DACerr\_C15} - \text{DACerr\_C16})$$

$$\text{DACerr\_C9} \cong \frac{1}{2}\cdot(-DCAL,\ C9 - \text{DACerr\_C10} - \text{DACerr\_C11} - \text{DACerr\_C12} - \text{DACerr\_C13} - \text{DACerr\_C14} - \text{DACerr\_C15} - \text{DACerr\_C16})$$

$$\text{DACerr\_C8} \cong \frac{1}{2}\cdot(-DCAL,\ C8 - \text{DACerr\_C9} - \text{DACerr\_C10} - \text{DACerr\_C11} - \text{DACerr\_C12} - \text{DACerr\_C13} - \text{DACerr\_C14} - \text{DACerr\_C15} - \text{DACerr\_C16})$$

Plugging in the previously calculated values of DCAL for each capacitor yields:

$$\text{DACerr\_C16} \cong \frac{\Delta Vref}{CDAC_{Upper}}\cdot(2\cdot\Delta C)$$

$$\text{DACerr\_C15} \cong \frac{\Delta Vref}{CDAC_{Upper}}\cdot(-1\cdot\Delta C)$$

$$\text{DACerr\_C14} \cong \frac{\Delta Vref}{CDAC_{Upper}}\cdot(0\cdot\Delta C)$$

-continued $$\text{DACerr\_C13} \cong \frac{\Delta Vref}{CDAC_{Upper}}\cdot(2\cdot\Delta C)$$

$$\text{DACerr\_C12} \cong \frac{\Delta Vref}{CDAC_{Upper}}\cdot(-1\cdot\Delta C)$$

$$\text{DACerr\_C11} \cong \frac{\Delta Vref}{CDAC_{Upper}}\cdot(-2\cdot\Delta C)$$

$$\text{DACerr\_C10} \cong \frac{\Delta Vref}{CDAC_{Upper}}\cdot(-3\cdot\Delta C)$$

$$\text{DACerr\_C9} \cong \frac{\Delta Vref}{CDAC_{Upper}}\cdot(1\cdot\Delta C)$$

$$\text{DACerr\_C8} \cong \frac{\Delta Vref}{CDAC_{Upper}}\cdot(2\cdot\Delta C)$$

The results of the calibration process aligns with the unknowns that were intended to be estimated. These results demonstrate that the calibration process successfully estimates the errors of the DAC capacitances. The equations for DACerr_C8 through DACerr_C16 show how the error of each capacitor is quantified in terms of $$\frac{\Delta Vref}{CDAC_{Upper}}$$

and ΔC.

In the implementation, these quantities are quantized by the ADC without losing accuracy in the correction, using 7 bits for each capacitance. The ADC phase control circuit 21 provides the ADC_TEST_CAPS signals that enable the estimation of MSB, MSB-1, and so on down to MSB-8 errors. The total number of bits required for the DACerr_C8 through DACerr_C16 is 63 bits, calculated as 7 bits multiplied by 9 capacitors. These 63 bits, calculated according to the previously explained equations, are stored in registers 22 at the end of the calibration procedure. During operational use, these stored bits are provided to the ADC 10 as a static correction.

The successive approximation process proceeds through several steps, starting with the most significant bit (MSB). In the first approximation, the capacitor C16_p_ in switched capacitor circuit 15(16) of DAC 13" and C16_n_ in switched capacitor circuit 35(16) of DAC 33", associated with the MSB and controlled by ADC_D<16:1>, are connected to VREF, which corresponds to the full scale of the ADC 10". Simultaneously, the calibration DACs 43 and 53 inject a correction equal to DACerr_C16. This forms a capacitive 1:1 divider with the rest of the matrix, resulting in a voltage at the comparator 11 input equal to −Vin+VREF/2. The comparator 11 then returns a value of 1 or 0, depending on whether Vin is greater or less than VREF/2, and ADC_D<16:1> is set to this binary value.

In the second approximation, the capacitors C15*p* in switched capacitor circuit 15(15) of DAC 13" and C15*n* in switched capacitor circuit 35(15) of DAC 33", associated with MSB-1 and controlled by ADC_D<15:1>, are connected to VREF/2. The calibration DACs 43 and 53 inject a correction equal to DACerr_C15, which depends on the result from ADC_D<16:1>, i.e., the result of the previous approximation.

This pattern continues for the following approximations. In each step, the corresponding capacitors are connected to progressively smaller fractions of VREF: VREF/4 for the third approximation, VREF/8 for the fourth, and so on. The calibration DACs 43 and 53 inject corrections (DACerr_C14, DACerr_C13, etc.) that depend on the results of all previous approximations.

By the eighth approximation, the capacitors C9*p* in switched capacitor circuit 15(9) of DAC 13" and C9*n* in switched capacitor circuit 35(9) of DAC 33", associated with MSB-7 and controlled by ADC_D<9:1>, are connected to VREF/128. The calibration DACs 43 and 53 inject a correction equal to DACerr_C9, which depends on the results from ADC_D<16:1> through ADC_D<10:1>. For the remaining approximations, from the ninth to the sixteenth, the capacitors C8*p* to C1*p* in switched capacitor circuits 15(8) to 14(1) of DAC 13" and C8*n* to C1*n* in switched capacitor circuits 35(8) to 34(1) of DAC 33", associated with MSB-8 through the LSB respectively, are controlled by ADC_D<8:1> through ADC_D<1:1>. These are connected to voltages ranging from VREF/256 for the ninth approximation to VREF/32768 for the sixteenth approximation. Concurrently, the calibration DACs 43 and 53 continue to operate in conjunction with the main DACs 13" and 33" to apply the appropriate corrections throughout these final approximation steps.

Note that while these capacitors (C8*p* to C1*p* and C8*n* to C1*n*) participate in the conversion process, they are not individually calibrated. Instead, during these final steps, the calibration DACs 43 and 53 inject a common correction equal to DACerr_C8 for all of these less significant bits. This correction depends on the results from ADC_D<16:1> through ADC_D<9:1>, i.e., the outcomes of the eight most significant bit decisions.

In this ADC 10" design, individual linearity correction is applied only to the 8 most significant capacitors (C16*p* to C9*p* and C16*n* to C9*n*), while a common correction factor is used for the remaining less significant capacitors. This balances accuracy with efficiency in the calibration process, as it has been found sufficient to achieve the desired performance while simplifying the calibration procedure and reducing the amount of calibration data that needs to be stored.

This method ensures that the most impactful errors (those in the most significant bits) are precisely corrected, while still providing some level of correction for the less significant bits. The result is an optimized balance between conversion accuracy and calibration complexity.

Finally, it is evident that modifications and variations can be made to what has been described and illustrated herein without departing from the scope of this disclosure.

Although this disclosure has been described with a limited number of embodiments, those skilled in the art, having the benefit of this disclosure, can envision other embodiments that do not deviate from the disclosed scope. Furthermore, skilled persons can envision embodiments that represent various combinations of the embodiments disclosed herein made in various ways.

The invention claimed is:

1. A successive approximation register (SAR) analog-to-digital converter (ADC) comprising:

a capacitive digital-to-analog converter (DAC) including a binary-weighted capacitor array;

a bridge capacitor separating the binary-weighted capacitor array into a first switched capacitor array connected to a first node and a second switched capacitor array connected to a second node, with a first terminal of the bridge capacitor being connected to the first node and a second terminal of the bridge capacitor being connected to the second node; and a multipurpose capacitor connected to the first node, wherein the multipurpose capacitor serves as both a termination capacitor for the first switched capacitor array and a shield between the first node and the bridge capacitor; and a dummy capacitor connected to the second node and serving as a shield between the second node and the bridge capacitor.

2. The SAR ADC of claim 1, wherein the capacitive DAC comprises metal layers, and wherein:

the multipurpose capacitor is formed by plates in second, third, fourth, fifth, and sixth ones of the metal layers;

the bridge capacitor is formed by plates in the second, third, fourth, fifth, and sixth ones of the metal layers; and the plates of the multipurpose capacitor and the bridge capacitor in the fifth and third metal layers are connected to one another.

3. The SAR ADC of claim 2, wherein:

upper plates of the bridge capacitor and the dummy capacitor are connected by a horizontal plate in the sixth metal layer; and the dummy capacitor includes a horizontal plate in the fifth metal layer connected to the horizontal plate in the sixth metal layer through a vertical line.

4. The SAR ADC of claim 3, wherein: the dummy capacitor is connected to a first capacitor of the second switched capacitor array; and a horizontal plate in the fifth metal layer of the dummy capacitor is connected to a corresponding horizontal plate in the fifth metal layer of the first capacitor.

5. The SAR ADC of claim 1, wherein the capacitive DAC comprises a layout in which the bridge capacitor is centrally located, the multipurpose capacitor is positioned adjacent to a first side of the bridge capacitor, the dummy capacitor is positioned adjacent to a second side of the bridge capacitor, and the first and second switched capacitor arrays are positioned on either side of the centrally located bridge capacitor.

6. The SAR ADC of claim 5, wherein the layout further comprises:

a tunnel created within a column containing the dummy capacitor; and a vertical metal line running through the tunnel to connect upper plates of capacitors across different columns of the binary-weighted capacitor array.

7. The SAR ADC of claim 6, wherein:

the vertical metal line is formed in the fifth metal layer; and the tunnel provides isolation between the vertical metal line and plates of capacitors.

8. The SAR ADC of claim 5, wherein:

each of the first and second switched capacitor arrays comprises multiple columns of capacitor elements;

each column of capacitor elements is formed of a plurality of unit capacitors; and columns representing more significant bits comprise a larger number of unit capacitors compared to columns representing less significant bits.

9. The SAR ADC of claim 1, wherein the capacitive DAC comprises multiple metal layers, and wherein:

the multipurpose capacitor is formed by conductive structures in at least three of the metal layers;

the bridge capacitor is formed by conductive structures in at least three of the metal layers; and at least two of the conductive structures of the multipurpose capacitor and the bridge capacitor in non-adjacent metal layers are electrically connected to one another.

10. The SAR ADC of claim 9, wherein:

upper conductive structures of the bridge capacitor and the dummy capacitor are electrically connected in an uppermost metal layer of the multiple metal layers; and the dummy capacitor includes a conductive structure in a metal layer below the uppermost metal layer, the conductive structure being electrically connected to the upper conductive structure through a vertical conductive element.

11. The SAR ADC of claim 10, wherein:

the dummy capacitor is electrically connected to a first capacitor of the second switched capacitor array; and a conductive structure of the dummy capacitor in a metal layer below the uppermost metal layer is electrically connected to a corresponding conductive structure of the first capacitor in the same metal layer.

12. The SAR ADC of claim 1, further comprising:

a first calibration DAC connected to the first node;

a second calibration DAC connected to the second node; and auto-calibration logic configured to control the first and second calibration DACs to inject error correction signals during analog-to-digital conversion.

13. The SAR ADC of claim 12, wherein the auto-calibration logic is configured to:

evaluate capacitance errors for a plurality of most significant capacitors in the binary-weighted capacitor array; and generate calibration coefficients based on the evaluated capacitance errors.

14. The SAR ADC of claim 13, wherein evaluating the capacitance errors comprises:

sequentially testing each of the plurality of most significant capacitors;

taking N readings for each tested capacitor, where N is a positive integer; and calculating an error value for each tested capacitor based on the N readings.

15. The SAR ADC of claim 14, further comprising:

registers configured to store the generated calibration coefficients; and wherein the auto-calibration logic is further configured to apply the stored calibration coefficients as static corrections during subsequent analog-to-digital conversions.

16. The SAR ADC of claim 12, further comprising an ADC phase control circuit configured to:

enable the auto-calibration logic to perform calibration when the SAR ADC switches from an idle state to an operative state; and manage a sequence of calibration phases for evaluating errors in the most significant capacitors of the binary-weighted capacitor array.

17. The SAR ADC of claim 13, wherein the plurality of most significant capacitors comprises the nine most significant capacitors in the binary-weighted capacitor array.

* * * * *